United States Patent [19]

Hasegawa

[11] Patent Number: 5,677,015
[45] Date of Patent: Oct. 14, 1997

[54] HIGH DIELECTRIC CONSTANT MATERIAL CONTAINING TANTALUM, PROCESS FOR FORMING HIGH DIELECTRIC CONSTANT FILM CONTAINING TANTALUM, AND SEMICONDUCTOR DEVICE USING THE SAME

[75] Inventor: Toshiaki Hasegawa, Kanagawa, Japan

[73] Assignee: Sony Corporation, Tokyo, Japan

[21] Appl. No.: 404,956

[22] Filed: Mar. 16, 1995

[30] Foreign Application Priority Data

Mar. 17, 1994 [JP] Japan .................. 6-072504
Mar. 17, 1994 [JP] Japan .................. 6-072505

[51] Int. Cl.$^6$ .................................. C23C 16/34
[52] U.S. Cl. .............. 427/576; 427/248.1; 427/255.2; 427/255.3; 427/590; 437/235
[58] Field of Search ................... 427/80, 126.1, 427/248.1, 255.2, 255.3, 576, 535, 590; 437/235

[56] References Cited

U.S. PATENT DOCUMENTS

| | | | |
|---|---|---|---|
| 4,943,450 | 7/1990 | Sarin | 427/255.2 |
| 4,947,081 | 8/1990 | Ohiwa et al. | 313/509 |
| 5,178,911 | 1/1993 | Gordon et al. | 427/255.2 |
| 5,248,629 | 9/1993 | Muroyama | 437/52 |
| 5,352,623 | 10/1994 | Kamiyama | 437/52 |

*Primary Examiner*—Shrive Beck
*Assistant Examiner*—Timothy Meeks
*Attorney, Agent, or Firm*—Hill, Steadman & Simpson

[57] ABSTRACT

A high dielectric constant material containing tantalum expressed by chemical formula $Ta_xO_yN_z$, where x, y, and z are each a value which in total yield 1, z is 0.1 or higher but 0.625 or lower, y is 0 or higher but 0.6 or lower, and 0.4y and 0.6z in total equals to the value of x or lower, and a process for depositing a film of the material by means of chemical vapor deposition using $Cp_mTa(N_3)_n$, where Cp represents cyclopentane, and m+n=5, or using a gaseous tantalum-containing organometallic compound, or by a means comprising plasma treatment under a gas containing nitrogen. Also claimed are a semiconductor device and a MOS transistor using the high dielectric film containing tantalum.

6 Claims, 1 Drawing Sheet

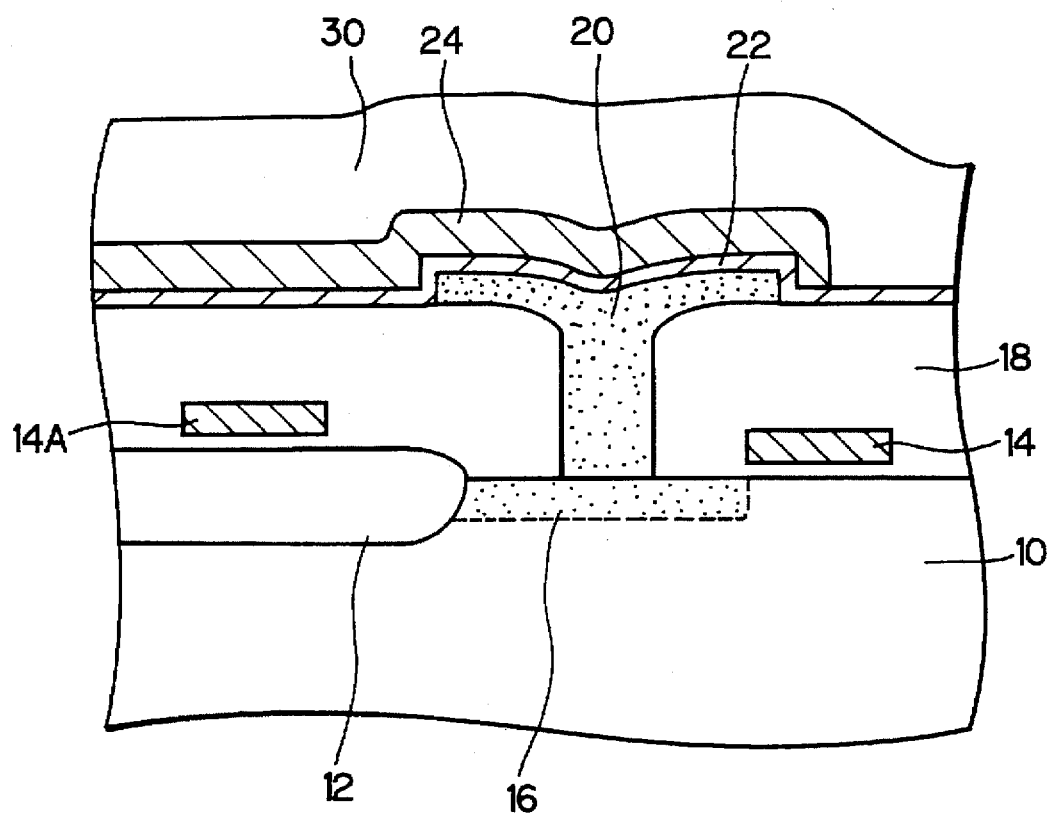

HIGH DIELECTRIC CONSTANT MATERIAL CONTAINING TANTALUM, PROCESS FOR FORMING HIGH DIELECTRIC CONSTANT FILM CONTAINING TANTALUM, AND SEMICONDUCTOR DEVICE USING THE SAME

BACKGROUND OF THE INVENTION

The present invention relates to a high dielectric stant (hereinafter referred to simply as "high dielectric") material, a process for forming a high dielectric film containing tantalum, and to a semiconductor device using the film as a capacitor insulating film and the like.

In the present-day semiconductor devices, silicon nitride ($Si_3N_4$) films are used as insulator films and capacitance insulating films. A capacitance insulating film is used, for example, as a capacitance for accumulating charge in a DRAM (dynamic random access memory). However, in an advanced ULSI (particularly DRAM), a material containing tantalum is studied as a material having a further higher specific dielectric constant than a silicon nitride, and its use in the place of a silicon nitride for a capacitance insulating film is considered. More specifically, for instance, a study on the use of $Ta_2O_5$ is under way. In general, the capacitance C of a capacitance insulating film can be obtained according to the following equation:

$$C = \epsilon \times S / d$$

where $\epsilon$ represents the specific dielectric constant, S represents the area, and d represents the thickness of the film. Because the area S of a capacitance insulating film is reduced inevitably with increasing density of the semiconductor device, the specific dielectric constant $\epsilon$ of the film must be increased to maintain the capacitance C at the same level. More specifically, in a bipolar transistor, for instance, the area of a capacitance insulating film increases as to account for a half of the entire area of the transistor element with decreasing area of the transistor element to one fifth of the initial size.

A tantalum oxide ($Ta_2O_5$) which constitutes the capacitance insulating film yields a high specific dielectric constant in a range of from 20 to 30. For reference, the specific dielectric constant of $Si_3N_4$ and $SiO_2$ is in a range of from 6 to 7 and from 3.7 to 3.9, respectively. A $Ta_2O_5$ film can be deposited by means of CVD process using gaseous $TaCl_5$ and $O_2$ as the starting materials.

As mentioned in the foregoing, a $Ta_2O_5$ film has a high specific dielectric constant and is believed promising as a material for high dielectric capacitance insulating film. However, problems concerning leak current characteristics and isolation voltage are yet to be solved. As a means for overcoming these problems, there is proposed a process comprising depositing a $Ta_2O_5$ film by means of CVD process on a body comprising a silicon substrate using gaseous $TaCl_5$ and $O_2$ as the starting materials, and then applying an active oxygen annealing treatment (for instance, irradiating ultraviolet radiation in the presence of gaseous $O_2$) to the as-deposited $Ta_2O_5$ film. The inferior leak current characteristics and isolation voltage characteristics are believed attributable to the presence of $Ta-O_x$ voids that generate in the $Ta_2O_5$ film during CVD due to the simultaneous drop out of tantalum atoms and surrounding oxygen atoms. Thus, by applying the active oxygen annealing treatment to the resulting $Ta_2O_5$ film, silicon atoms which migrate from the silicon substrate and the oxygen atoms which diffuses into the $Ta_2O_5$ film are believed to compensate for the deficient tantalum and oxygen atoms to fill the $Ta-O_x$ voids. Assumably, the leak current characteristics and the isolation voltage characteristics are improved according to this mechanism.

In addition to the active oxygen annealing treatment described above, another means is proposed to further improve the leak current characteristics and the isolation voltage characteristics of a $Ta_2O_5$ film. According to the process, a $Ta_2O_5$ film is deposited by means of low pressure CVD (LPCVD) using gaseous $Ta(OC_2H_5)_5$ and $O_2$ as the starting materials, and then a high frequency oxygen plasma treatment is applied to the resulting $Ta_2O_5$ film. By applying a high frequency oxygen plasma treatment to the $Ta_2O_5$ film, carbon and hydrogen atoms in the $Ta_2O_5$ film can be driven out of the film by diffusion, while filling the oxygen defects with oxygen atoms. The leak current characteristics and the isolation voltage characteristics are believed to be improved according to this mechanism.

In case of depositing a high dielectric film comprising $Ta_2O_5$ by means of CVD, the use of a gaseous tantalum (Ta)-containing organometallic compound is increasing, because it can be handled with greater ease as compared with a gaseous $TaCl_5$. However, in using a tantalum-containing organometallic compound as the starting gaseous material, carbon (C) is taken up by the amorphous high dielectric film during the deposition of the film, and the carbon contamination in a high dielectric film is found to be a serious problem to be overcome. The leak current characteristics are impaired by such a carbon contamination. It is possible to remove carbon from the high dielectric film to a certain extent, however, the efficiency of removal is still low.

As described in the foregoing, the high frequency oxygen plasma treatment above is found still insufficient for improving leak current characteristics and the isolation voltage characteristics. Accordingly, it is strongly desired to provide a high dielectric film superior to a $Ta_2O_5$ film in terms of leak current characteristics and isolation voltage characteristics. The leak current characteristics and the isolation voltage characteristics of a high dielectric film can be effectively improved by increasing the thickness d of the high dielectric film. However, the capacitance C of the high dielectric film decreases with increasing thickness d. These conflicting requirements can be circumvented by selecting a material having a further higher specific dielectric constant $\epsilon$ for the high dielectric film.

Accordingly, an object of the present invention is to provide a tantalum-containing high dielectric material having a higher specific dielectric constant than that of a $Ta_2O_5$.

Another object of the present invention is to provide a process for forming a tantalum-containing high dielectric film further improved in leak current characteristics and isolation voltage characteristics.

A still other object of the present invention is to provide a semiconductor device using the high dielectric film above.

SUMMARY OF THE INVENTION

In accordance with a first aspect of the present invention, there is provided a high dielectric material containing tantalum expressed by chemical formula $Ta_xO_yN_z$, where x, y, and z are each a value which in total yield 1, z is 0.1 or higher but 0.625 or lower, y is 0 or higher but 0.6 or lower, and 0.4y and 0.6z in total equals to the value of x or lower.

If z represents a value of lower than 0.1, $Ta_2O_5$ is nitrided only insufficiently, and hence, the specific dielectric constant thereof would not be improved. The upper limit for z is 0.625 according to stoichiometry, because when y is 0, $Ta_xO_yN_z$ corresponds to $Ta_3N_5$. By taking the stoichiometric requirements into consideration, y cannot exceed 0.6 when z represents a value of 0.1 or higher. Thus, so long as y and z fall in a range defined above, the value of x is equal to or greater than the sum of 0.4y and 0.6z. The tantalum-containing high dielectric material expressed by $Ta_xO_yN_z$ according to the present invention is basically characterized in that it contains from 10 to 62.5% by atomic of nitrogen atoms, and so long as the nitrogen atoms are present in this range, the content for Ta and O (values for x and y) naturally falls in the range described above.

According to a second aspect of the present invention, there is provided a process for forming a tantalum-containing high dielectric film expressed by $Ta_xO_yN_z$ with x, y, and z satisfying the relation as described in the first aspect, the process comprising forming the high dielectric film on a body by chemical vapor deposition (CVD) using $Cp_mTa(N_3)_n$ (where Cp represents cyclopentane and m and n are values which in total yield 5) as the starting material.

According to a third aspect of the present invention, there is provided a process for forming a tantalum-containing high dielectric film expressed by $Ta_xO_yN_z$ with x, y, and z satisfying the relation as described in the first aspect, the process comprising forming the high dielectric film on a body by CVD using a tantalum-containing organometallic material, preferably selected from the group consisting of $Ta(OC_2H_5)_5$, $Ta(OCH_3)_5$, $Ta(N(CH_3)_2)_5$, $TaCl_5$, $Ta(OC_2H_5)_m(N(CH_3)_2)_n$, and $Ta(OCH_3)_m(N(CH_3)_2)_n$, where m and n are values which in total yield 5.

According to a fourth aspect of the present invention, there is provided a process for forming a tantalum-containing high dielectric film expressed by $Ta_xO_yN_z$ with x, y, and z satisfying the relation as described in the first aspect, the process comprising forming a tantalum-containing high dielectric film on a body, and applying a plasma treatment to the high dielectric film using a gas containing at least nitrogen.

According to a fifth aspect of the present invention, there is provided a semiconductor device comprising a tantalum-containing high dielectric material as described in the first aspect.

BRIEF DESCRIPTION OF THE DRAWINGS

FIG. 1 is a schematically drawn partial cross section of a semiconductor device comprising a silicon nitride film as a capacitor insulating film.

DETAILED DESCRIPTION OF PREFERRED EMBODIMENTS

In a preferred embodiment according to the aspects of the present invention, the CVD process is preferably a thermal CVD or a plasma-assisted CVD. In an embodiment according to the third aspect of the present invention, the gas containing nitrogen is preferably selected from the group consisting of gaseous $NH_3$, a mixed gas of $NH_3$ and $O_2$, a mixed gas of $NH_3$ and $O_3$, a gaseous $N_2O$, a gaseous $N_2H_2$, and gaseous nitrogen ($N_2$), however, particularly preferred is the use of gaseous $NH_3$.

In a preferred embodiment according to a fourth aspect of the present invention, the high dielectric film is deposited on the body by means of a thermal CVD or a plasma-assisted CVD using a gaseous organometallic material as the starting material.

In another embodiment, the process comprises forming a tantalum-containing high dielectric film on the body, and then applying a plasma treatment to the resulting high dielectric film using a gas containing at least nitrogen.

In the embodiments according to the fourth aspect of the present invention, the organometallic material is preferably selected from the group consisting of $Ta(OC_2H_5)_5$, $Ta(OCH_3)_5$, $Ta(N(CH_3)_2)_5$, $TaCl_5$, $Ta(OC_2H_5)_m(N(CH_3)_2)_n$, and $Ta(OCH_3)_m(N(CH_3)_2)_n$, where m and n are values which in total yield 5.

The plasma treatment is effected in a gas containing at least nitrogen, and preferably, in gaseous $NH_3$ or a mixed gas of $NH_3$ and $O_2$. Other usable gases containing nitrogen include those of $N_2O$, $N_2H_2$, and $N_2$.

In case of forming first a tantalum-containing high dielectric film on the body, and then applying a plasma treatment to the resulting high dielectric film using a gas containing at least nitrogen, usable gases containing nitrogen include those of $NH_3$, $N_2O$, $N_2H_2$, and $N_2$, but particularly preferred among them is gaseous $NH_3$.

As compared with a $Si_3N_4$ film, in general, a high dielectric film based on $Ta_2O_5$ yields a high specific dielectric constant, but is inferior in leak current characteristics and isolation voltage characteristics. The tantalum-containing high dielectric material according to the present invention contains nitrogen atoms at a concentration of from 10 to 62.5% by atomic. Because a nitrogen atom is smaller than an oxygen atom in terms of atomic radius, a nitrogen atom is stronger in affinity in case of forming bonds with other atoms. Accordingly, as compared with a case of tantalum oxide, i.e., $Ta_2O_5$, electrons tend to localize in the tantalum-containing high dielectric material according to the present invention. The high specific dielectric constant of the tantalum-containing high dielectric material according to the present invention is believed to be exhibited based on this mechanism.

As compared with a $Ta_2O_5$ film, the tantalum-containing high dielectric film according to the present invention yields a higher specific dielectric constant $\epsilon$. Accordingly, in the following equation:

$$C = \epsilon \times S/d,$$

the thickness d of the capacitance insulating film can be increased in case of maintaining the capacitance C of the capacitance insulating film at the same value. By increasing the thickness d of the capacitance insulation film, the electric field (as expressed by the unit of V/cm) can be decreased. Considering DRAMs and the like having capacitance insulation films, this signifies that, if a same voltage were to be applied to capacitance insulation films differing in thickness, a lower electric field results for a thicker capacitance insulation film. The leak current characteristics and the isolation voltage characteristics can be improved in this manner.

As described above, the process for forming a high dielectric film according to a fourth embodiment of the present invention comprises subjecting a high dielectric film to a plasma treatment using a gas containing at least nitrogen, for instance, gaseous $NH_3$. Because nitrogen atoms are smaller in diameter as compared with oxygen atoms, they can be easily taken up by the high dielectric film. The nitrogen atoms then react with carbon atoms in the film, and as a result, carbon atoms are easily drawn out from the film in the form of CN. Moreover, nitrogen atoms are particularly effective in recovering and compensating the oxygen defects such as $Ta—O_x$ voids in the film. More specifically, nitrogen atoms are more apt to form bonds with tantalum atoms, because a nitrogen atom has less outer-shell electrons as compared with an oxygen atom. Accordingly, the leak current characteristics and the isolation voltage characteristics can be improved more effectively by employing the present process instead of a conventional high frequency oxygen plasma treatment.

In the other embodiment according to the fourth aspect of the present invention, the tantalum-containing high dielectric film is deposited on the body by means of a thermal CVD or a plasma-assisted CVD using a gas containing at least nitrogen as the starting gaseous material. Because nitrogen atoms are smaller in diameter as compared with oxygen atoms, they can be easily taken up by the high dielectric film. The nitrogen atoms then react with carbon atoms in the film, and as a result, carbon atoms are easily drawn out from the film in the form of CN. Moreover, nitrogen atoms are particularly effective in recovering and compensating the oxygen defects such as Ta—$O_x$ voids in the film. Thus, the leak current characteristics and the isolation voltage characteristics can be improved more effectively by employing the present process in the place of a conventional high frequency oxygen plasma treatment.

The present invention is described in further detail below referring to the preferred embodiments according to the present invention. It should be understood, however, that the present invention is not to be construed as being limited to the examples below.

EXAMPLE 1

The present example refers to a process for forming a high dielectric film comprising a tantalum-containing high dielectric material expressed by chemical formula $Ta_3N_5$ (i.e., $Ta_xO_yN_z$ with x=0.375, y=0, and z=0.625) on a body made of a polysilicon film using $Cp_2Ta(N_3)_3$ (where Cp represents cyclopentane) as the starting material. The high dielectric film was deposited by means of plasma-assisted CVD in a sheet-fed plasma CVD apparatus using a mixed gas comprising $Cp_2Ta(N_3)_3$ and $N_2$ each flown at a rate of 100 and 50 sccm, respectively, under a pressure of 30 Pa while maintaining the body at a temperature of 400° C., and applying an RF power of 500 W (13.56 MHz). Gaseous $N_2$ functions as a carrier gas and a diluting gas in this case, and it may be replaced by gaseous argon (Ar) or gaseous helium (He). The tantalum-containing organometallic material for use in the process is not only limited to $Cp_2Ta(N_3)_3$, and other materials expressed by $Cp_mTa(N_3)_n$ (where, m+n=5) can be used as well. Thus was obtained a tantalum-containing high dielectric film comprising $Ta_3N_5$ having a specific dielectric constant of 40 or higher.

The same process was repeated except for further adding a gaseous oxygen ($O_2$) at a flow rate of 50 sccm. A high dielectric film expressed by $Ta_xO_yN_z$ with x being 0.5, y being 0.1, and z being 0.4 was obtained as a result. The specific dielectric constant thereof was found to be in a range of from 30 to 40, a value slightly lower than that of a tantalum-containing high dielectric film comprising $Ta_3N_5$, but with improved leak current characteristics.

EXAMPLE 2

The present example refers to a modification for a process for forming a high dielectric film described in Example 1. Thus, a high dielectric film was deposited by means of low pressure thermal CVD instead of using plasma-assisted CVD as in Example 1. Gaseous $Cp_2Ta(N_3)_3$ was used as the starting tantalum-containing organometallic material, together with gaseous $NH_3$ for nitridation and gaseous $O_3$ for oxidation. The low pressure thermal CVD was effected using a gaseous mixture in which $Cp_2Ta(N_3)_3$, $NH_3$, and $O_3$ were flown at a rate of from 100 to 500 sccm, from 500 to 1,000 sccm, and from 100 to 500 sccm, respectively, under a pressure of from 10 to 200 Pa while maintaining the body at a temperature of from 400° to 800° C. Thus was deposited a high dielectric film expressed by $Ta_xO_yN_z$ with x being 0.5, y being 0.4, and z being 0.1, and having a specific dielectric constant in a range of from 20 to 40.

EXAMPLE 3

The present example refers to a process for forming a high dielectric film comprising a tantalum-containing high dielectric material expressed by $Ta_xO_yN_z$ with x being 0.5, y being 0.3, and z being 0.2 on a body made of a polysilicon film using $Ta(OC_2H_5)_5$ as a tantalum-containing organometallic material and gaseous $NH_3$ as the starting materials. The high dielectric film was deposited by means of plasma-assisted CVD in a plasma CVD apparatus using a mixed gas comprising $Ta(OC_2H_5)_5$ and $NH_3$ each flown at a rate of from 100 to 500 sccm and from 500 to 2,000 sccm, respectively, under a pressure of from 10 to 100 Pa while maintaining the body at a temperature of from 200° to 500° C., and applying an RF power of from 500 to 1,000 W (13.56 MHz).

Thus was obtained a tantalum-containing high dielectric film expressed by $Ta_xO_yN_z$ and having a specific dielectric constant in a range of from 20 to 50. The high dielectric film can be deposited otherwise by using gaseous $O_3$ together with the other gaseous materials to deposit the film by means of low pressure thermal CVD.

EXAMPLE 4

The present example relates to a process for forming a high dielectric film according to an embodiment of the present invention. The process comprises forming a tantalum-containing high dielectric film on a body, and applying plasma treatment to the high dielectric film using a gas containing at least nitrogen (N), for instance, a gaseous mixture containing $NH_3$ and $O_2$. In the present example, the tantalum-containing high dielectric film can be formed on the body by a known method. Thus, the process in the present example is distinguished from a prior art technique in that it comprises a plasma treatment using a gas containing at least nitrogen.

A tantalum-containing high dielectric film expressed by $Ta_2O_5$ was deposited on a body by means of low pressure (LP) thermal CVD process in a sheet-fed LPCVD apparatus using a gaseous mixture comprising $TaCl_5$ or $Ta(OC_2H_5)_5$ and 5% by volume of $O_3$ as the starting material. Thus, LPCVD was effected on a body comprising, for example, a polysilicon film maintained in a temperature range of from 300° to 500° C., while keeping the pressure inside the reaction chamber of the LPCVD apparatus in a range of from 10 to 1,000 Pa. A high dielectric film about 10 nm in thickness was obtained as a result. The process can be effected otherwise by using a mixed gas of $O_3$ and $O_2$ instead of using gaseous $O_3$, and by means of plasma-assisted CVD. It is also possible to use a batch-type LPCVD apparatus in the place of a sheet-fed LPCVD apparatus.

The thus deposited high dielectric film was then subjected to plasma treatment. More specifically, the dielectric film was subjected to plasma treatment by applying an RF power of 200 W for a duration of 10 minutes while flowing a 1:10 mixture of gaseous $NH_3$ and gaseous $O_2$ at a rate of 500 sccm in total, and maintaining the body in a temperature range of from 400° to 800° C. Preferably, the thicker the high dielectric film becomes, the longer the plasma treatment is applied. The plasma treatment can be conducted subsequent to the previous step in the same CVD apparatus as that used in the previous step; i.e., the LPCVD apparatus equipped with an electrode for supplying an RF power source. Preferably, a heat treatment at a temperature of about 700° C. is applied to the high dielectric film after the plasma treatment to render the amorphous high dielectric film polycrystalline.

The leak current characteristics of the high dielectric were studied. A current density of $10^{-5}$ A/cm$^2$ or lower was found under an applied electric field of 5 MV/cm. However, a high dielectric film not subjected to plasma treatment above was found to yield a current density as high as $10^{-1}$ A/cm$^2$ or higher. Furthermore, a high dielectric film obtained by applying a conventional high frequency oxygen plasma treatment was found to yield a current density of about $10^{-3}$ A/cm$^2$.

EXAMPLE 5

The present example relates to a process for forming a high dielectric film according to an embodiment of the present invention. The process comprises forming a tantalum-containing high dielectric film on a body by means of CVD process using a gas containing at least nitrogen (e.g., gaseous NH$_3$) and an organometallic material as the starting gaseous material. The process of the present example differs from that of Example 5 in that no plasma treatment is applied to the high dielectric film after depositing the film. The process of the present example is distinguished from a related art technique in that a high dielectric film is deposited by CVD using a gas containing at least nitrogen as a part of the starting gaseous material.

A high dielectric film was deposited on a body, for instance, a polysilicon body, by means of plasma-assisted CVD in a sheet-fed plasma CVD apparatus using a mixed gas comprising Ta(OC$_2$H$_5$)$_5$ and NH$_3$ as the starting gaseous material with gaseous O$_2$ further added therein. Thus, plasma CVD was conducted while maintaining the body at a temperature in a range of from 300° to 500° C., and the pressure inside the reaction chamber in a range of from 10 to 1,000 Pa. During the film deposition, the 1:1 gaseous mixture of NH$_3$ and O$_2$ was flow at a rate of 500 sccm in total. A high dielectric film about 10 nm in thickness was obtained as a result.

The high dielectric film can be deposited otherwise by low pressure thermal CVD using gaseous O$_3$ as a starting material in the place of gaseous O$_2$. Preferably after the film deposition, heat treatment at a temperature of about 700° C. is applied to the as-deposited resulting high dielectric film to convert the amorphous high dielectric film into a polycrystalline state. A batch-type plasma CVD apparatus is also usable instead of a sheet-fed plasma CVD apparatus.

The leak current characteristics of the thus obtained high dielectric were found to be approximately the same as those of the high dielectric film fabricated in Example 4. The process of the present Example for forming the high dielectric film yields an improved throughput, because the plasma treatment after depositing the high dielectric film can be omitted.

It is also possible to conduct the step of plasma treatment on the as-deposited high dielectric film as described in Example 4 after depositing the high dielectric film by plasma-assisted CVD or by LP thermal CVD as described above in the present Example, however, at the expense of high throughput. Improved leak characteristics and isolation voltage characteristics can be obtained on the film, however.

EXAMPLE 6

Referring to FIG. 1, the present example relates to a process for fabricating a semiconductor device comprising a DRAM (dynamic random access memory) based on a stacked capacitor cell structure having a capacitance insulating film obtained by a process for forming a high dielectric film according to a process of an embodiment of the present invention. The capacitance insulating film comprises a tantalum-containing high dielectric material expressed by Ta$_x$O$_y$N$_z$. The semiconductor device with reference to FIG. 1 can be fabricated by a process comprising:

forming a LOCOS structured element isolating region 12 on the silicon semiconductor substrate 10;

forming a gate electrode 14 and a gate interconnection 14A (word line) by using, for example, polysilicon;

forming source/drain region 16;

after forming an interlayer dielectric layer 18 of, e.g., SiO$_2$, on the entire surface, providing an opening on the interlayer dielectric layer 18 located on the upper side of the source/drain region 16, and forming an electrode 20 for the capacitor on the opening and the interlayer dielectric layer 18 by using, for example, polysilicon;

forming a high dielectric film 22 expressed by Ta$_x$O$_y$N$_z$ on the electrode 20 and the interlayer dielectric film 18 by means of the process for forming a high dielectric film according to an embodiment of the present invention; in this case, the polysilicon electrode 20 and the interlayer dielectric layer 18 correspond to the body, and the high dielectric film 22 corresponds to the capacitance insulating film;

forming an ONO electrode 24 for the capacitor; and forming an SiN passivation film on the entire surface of the resulting structure.

A high dielectric film according to the present invention is used as a dielectric film for a capacitor in the example above, however, it is also effective to use the film as a gate insulating film of a MOS transistor.

The present invention has been described in detail with reference to preferred embodiments. However, the starting gaseous materials, conditions for film deposition, etc., described above are simply provided for means of explanation, and they can be modified as desired depending on the CVD apparatus and on the CVD process to be used in practice.

The high dielectric film comprising according to the present invention is also applicable to any type of semiconductor device using a capacitance insulating film irrespective of the device structure. More specifically, it can be used as a gate insulating film of a MOS transistor. Although the tantalum-containing high dielectric material of the present invention is used mainly for the high dielectric film of a semiconductor device in the description above, it is also useful in the fabrication of a discrete component, e.g., a capacitor.

Conclusively, the tantalum-containing high dielectric material expressed by Ta$_x$O$_y$N$_z$ according to a first aspect of the present invention contains nitrogen (N), and yields a higher specific dielectric constant as compared with the case of Ta$_2$O$_5$. Accordingly, a thicker high dielectric film with improved leak current characteristics and isolation voltage characteristics can be implemented.

According to another aspect of the present invention, a high dielectric film is subjected to plasma treatment using a gas containing at least nitrogen (N) after depositing the film. According to a still other aspect of the present invention, a high dielectric film is deposited on a body by means of CVD process by using a gas containing at least nitrogen (N) as a starting gaseous material. Thus, carbon can be effectively pulled out from the high dielectric film either during or after depositing the high dielectric film, and the oxygen defects are also effectively compensated. In this manner, a high dielectric film having excellent leak current characteristics and isolation voltage characteristics can be implemented.

By carrying out the film deposition process of the second and the third aspect of the present invention, the step of plasma treatment can be basically omitted from the process comprising a step of plasma treatment. A simpler process can be thereby realized.

While the invention has been described in detail and with reference to specific embodiments thereof, it will be apparent to one skilled in the art that various changes and modifications can be made therein without departing from the spirit and scope thereof.

What is claimed is:

1. A method for making a tantalum-containing dielectric layer on a substrate comprising the steps of:

providing a substrate having a surface; and forming a tantalum-containing dielectric film on the surface by plasma-assisted chemical vapor deposition using a mixed gas comprising a cyclopentane tantalum azide having the formula (cyclopentyl)$_m$Ta(N$_3$)$_n$, wherein m and n are greater then 0 and m+n=5 and a nitrogen-containing gas selected from NH$_3$, N$_2$O, N$_2$H$_2$, or N$_2$.

2. A method as defined in claim 1, wherein the forming step is performed at a pressure of about 30 Pa, a substrate temperature of about 400° C. and an applied RF power of about 500 W.

3. A method as defined in claim 1, wherein the tantalum-containing dielectric film formed comprises Ta$_3$N$_5$ and has a specific dielectric constant of 40 or higher.

4. A method as defined in claim 1, wherein the mixed gas further comprises an oxygen-containing gas selected from O$_2$ or O$_3$.

5. A method as defined in claim 1, wherein the tantalum-containing dielectric film formed has a nitrogen concentration of from 10 to 62.5 atomic %.

6. A method for making a tantalum-containing dielectric layer on a substrate comprising the steps of:

providing a substrate having a surface; and forming a tantalum-containing dielectric film on the surface by low pressure thermal chemical vapor deposition at a pressure of from 10 to 200 Pa and at a substrate temperature of from 400° to 800° C. using a mixed gas comprising a cyclopentane tantalum azide having the formula (cyclopentyl)$_m$Ta(N$_3$)$_n$, wherein m and n are greater than 0 and m+n=5, a nitrogen-containing gas selected from NH$_3$, N$_2$O, N$_2$H$_2$ or N$_2$ and an oxygen-containing gas selected from O$_2$ or O$_3$.

* * * * *